US008068339B2

(12) United States Patent
Kayama et al.

(10) Patent No.: US 8,068,339 B2
(45) Date of Patent: Nov. 29, 2011

(54) AXIAL FAN APPARATUS, HOUSING, AND ELECTRONIC APPARATUS

(75) Inventors: Shun Kayama, Saitama (JP); Yukiko Shimizu, Saitama (JP); Kazutoshi Yamamoto, Tokyo (JP)

(73) Assignee: Sony Corporation, Tokyo (JP)

( * ) Notice: Subject to any disclaimer, the term of this patent is extended or adjusted under 35 U.S.C. 154(b) by 282 days.

(21) Appl. No.: 12/101,558

(22) Filed: Apr. 11, 2008

(65) Prior Publication Data

US 2008/0259564 A1 Oct. 23, 2008

(30) Foreign Application Priority Data

Apr. 17, 2007 (JP) ................................. 2007-107749

(51) Int. Cl.
*H05K 7/20* (2006.01)
*F04D 29/52* (2006.01)
*F04D 29/38* (2006.01)

(52) U.S. Cl. ................... 361/695; 361/679.48; 165/121; 165/122; 165/124; 415/208.5; 415/213.1; 415/221; 416/223 R; 416/236 A; 416/228; 417/423.14; 417/423.15

(58) Field of Classification Search ............. 361/679.46, 361/679.48, 679.49, 679.5, 690–697, 704–712; 165/80.3, 121–124, 126; 415/1, 60, 48–50, 415/58, 93, 220, 223, 211.1, 213.1, 214.1, 415/177, 178, 221, 119, 173.1, 187, 208.5; 416/238, 223 R, 243, 203, 235, 247 R; 417/423.14, 417/423.15; 310/51, 58, 59, 62, 63, 60 A, 310/40 R, 89
See application file for complete search history.

(56) References Cited

U.S. PATENT DOCUMENTS

| | | | | |
|---|---|---|---|---|
| 1,041,913 | A * | 10/1912 | Tyson | 416/236 R |
| 2,014,032 | A * | 9/1935 | Sharpe et al. | 416/228 |
| 2,104,306 | A * | 1/1938 | McLeod | 416/228 |
| 4,128,363 | A * | 12/1978 | Fujikake et al. | 416/236 A |
| 4,189,281 | A * | 2/1980 | Katagiri et al. | 415/222 |
| 4,227,710 | A * | 10/1980 | Laub | 280/47.19 |
| 4,265,596 | A * | 5/1981 | Katagiri et al. | 416/236 A |
| 4,664,593 | A * | 5/1987 | Hayashi et al. | 415/119 |
| 4,757,587 | A * | 7/1988 | Choi | 29/889.3 |
| 5,226,783 | A * | 7/1993 | Mita | 416/223 R |

(Continued)

FOREIGN PATENT DOCUMENTS

JP 62-284999 12/1987

(Continued)

OTHER PUBLICATIONS

Japanese Patent Office Action corresponding to Japanese Serial No. 2007-107749 dated Jun. 30, 2009.

(Continued)

*Primary Examiner* — Michail V Datskovskiy
(74) *Attorney, Agent, or Firm* — SNR Denton US LLP

(57) ABSTRACT

There is provided an axial fan apparatus including an axial-flow impeller, a drive unit, and a housing. The axial-flow impeller is capable of rotating and includes a plurality of blades inclined with respect to a rotational axis direction. The drive unit rotates the axial-flow impeller. The housing is mounted with the drive unit, and includes a sidewall, and a plurality of slits that circulate gas. The sidewall is provided around the axial-flow impeller. The plurality of slits are provided to the sidewall and inclined with respect to the rotational axis direction in a direction opposed to a direction in which the plurality of blades incline.

13 Claims, 14 Drawing Sheets

U.S. PATENT DOCUMENTS

| | | | | |
|---|---|---|---|---|
| 5,288,203 | A * | 2/1994 | Thomas | 165/80.3 |
| 5,407,324 | A * | 4/1995 | Starnes et al. | 415/208.5 |
| 5,601,410 | A * | 2/1997 | Quinlan | 416/241 A |
| 5,707,205 | A * | 1/1998 | Otsuka | 415/119 |
| 6,024,537 | A * | 2/2000 | Moreau et al. | 416/192 |
| 6,132,171 | A * | 10/2000 | Fujinaka et al. | 415/208.5 |
| 6,152,214 | A * | 11/2000 | Wagner | 165/121 |
| 6,179,562 | B1 * | 1/2001 | Fujinaka | 415/208.5 |
| 6,183,196 | B1 * | 2/2001 | Fujinaka | 415/208.5 |
| 6,254,342 | B1 * | 7/2001 | Fujinaka et al. | 415/208.5 |
| 6,293,753 | B1 * | 9/2001 | Pal et al. | 415/221 |
| 6,296,446 | B1 * | 10/2001 | Ishijima et al. | 416/236 A |
| 6,406,258 | B1 * | 6/2002 | Lin et al. | 415/213.1 |
| 6,683,500 | B2 * | 1/2004 | Jeong | 330/296 |
| 6,710,486 | B1 * | 3/2004 | Horng et al. | 310/89 |
| 6,796,768 | B2 * | 9/2004 | Fujinaka et al. | 415/208.5 |
| 6,796,771 | B2 * | 9/2004 | Suzuki | 416/228 |
| 6,942,457 | B2 * | 9/2005 | Pennington et al. | 416/144 |
| 6,994,523 | B2 * | 2/2006 | Eguchi et al. | 416/228 |
| 7,063,504 | B2 * | 6/2006 | Huang et al. | 415/165 |
| 7,080,970 | B2 * | 7/2006 | Horng et al. | 415/213.1 |
| 7,223,068 | B2 * | 5/2007 | Horng et al. | 415/187 |
| 7,391,611 | B2 * | 6/2008 | Ko et al. | 361/695 |

FOREIGN PATENT DOCUMENTS

| | | | |
|---|---|---|---|
| JP | 404086399 | A * | 3/1992 |
| JP | 04-183998 | | 6/1992 |
| JP | 10-018995 | | 1/1998 |
| JP | 11-324995 | | 11/1999 |
| JP | 3101363 | | 8/2000 |
| JP | 2001-003900 | | 1/2001 |
| JP | 2002-364594 | | 12/2002 |

OTHER PUBLICATIONS

A Japanese Office Action dated Dec. 2, 2008 issued in connection with counterpart Japanese Patent Application No. 2007-107749.

* cited by examiner

6500rpm

| RPM | 6500 | 6500 | 6500 | 6520 | 6520 | 6520 | 6520 | 6530 | 6560 | 6530 | 6400 |
|---|---|---|---|---|---|---|---|---|---|---|---|
| Flow rate(m3/min) | 0.131 | 0.127 | 0.121 | 0.113 | 0.102 | 0.096 | 0.085 | 0.073 | 0.060 | 0.046 | 0.000 |
| Static pressure(Pa) | 0 | 1 | 3.9 | 7.7 | 11.5 | 13.2 | 15.2 | 17.3 | 19.3 | 21.3 | 27.5 |
| Noise (dBA/1m) | 29 | 29.8 | 30 | 29.8 | 30.5 | 30 | 30.5 | 30 | 30.8 | 31.8 | 35.5 |

FIG.9A

6200rpm

| RPM | 6220 | 6210 | 6220 | 6230 | 6120 | 6220 | 6210 | 6240 | 6260 | 6240 | 6120 |
|---|---|---|---|---|---|---|---|---|---|---|---|
| Flow rate(m3/min) | 0.126 | 0.120 | 0.114 | 0.107 | 0.102 | 0.094 | 0.088 | 0.073 | 0.061 | 0.043 | 0.000 |
| Static pressure(Pa) | 0 | 1 | 4 | 7.4 | 9.3 | 11.5 | 12.9 | 15.2 | 16.8 | 19.2 | 25.2 |
| Noise (dBA/1m) | 28 | 28 | 28.5 | 29 | 28.8 | 28.8 | 29 | 30 | 30 | 30.5 | 34.5 |

FIG.9B

6500rpm

| RPM | 6500 | 6450 | 6440 | 6400 | 6380 | 6400 | 6470 | 6540 | 6590 | 6510 | 6370 | 6110 |
|---|---|---|---|---|---|---|---|---|---|---|---|---|
| Flow rate(m3/min) | 0.141 | 0.133 | 0.128 | 0.120 | 0.111 | 0.104 | 0.095 | 0.085 | 0.073 | 0.064 | 0.046 | 0.000 |
| Static pressure(Pa) | 0 | 3 | 4.9 | 7.5 | 9.3 | 10.5 | 11.1 | 12.1 | 13.7 | 16.2 | 21.8 | 36.4 |
| Noise (dBA/1m) | 26 | 26 | 26.8 | 28 | 29.5 | 31.5 | 35.8 | 39.5 | 39 | 38.5 | 38 | 38 |

FIG.9C

FIG.14A
FIG.14B
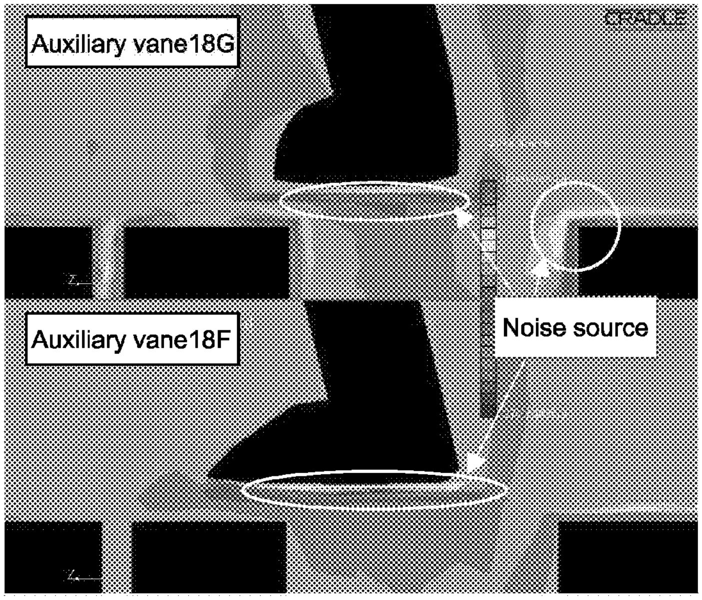
FIG.15A
FIG.15B
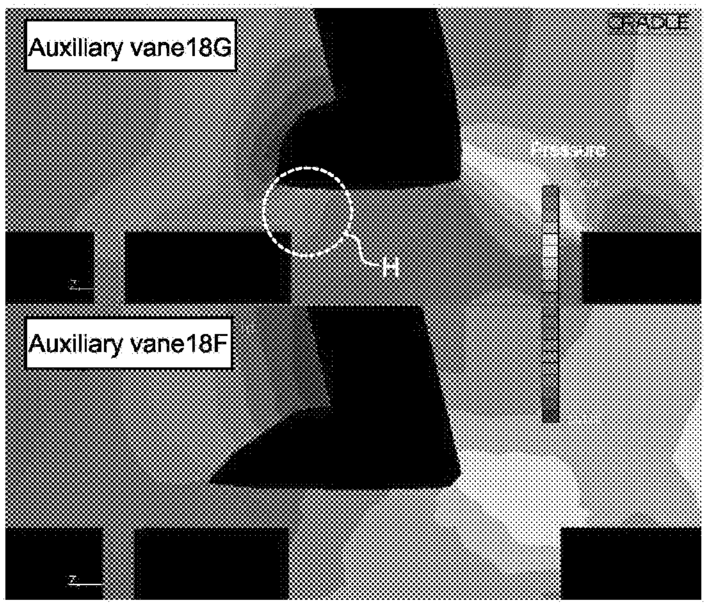

AXIAL FAN APPARATUS, HOUSING, AND ELECTRONIC APPARATUS

CROSS REFERENCES TO RELATED APPLICATIONS

The present invention contains subject matter related to Japanese Patent Application JP 2007-107749 filed in the Japanese Patent Office on Apr. 17, 2007, the entire contents of which being incorporated herein by reference.

BACKGROUND OF THE INVENTION

1. Field of the Invention

The present invention relates to an axial fan apparatus that blows air in an axial-flow direction, a housing that is used for the axial fan apparatus, and an electronic apparatus that is mounted with the axial fan apparatus.

2. Description of the Related Art

Recently, fans are used to cool down heat generators in most electronic apparatuses such as PCs. Herein, it is necessary to increase flow rate of the fans and to reduce noise generated by the operating fans.

Japanese Patent Application Laid-open No. 2001-003900 (paragraphs 0016 and 0017, FIG. 1; hereinafter referred to as Patent Document 1) discloses an axial-flow fan including a housing (5) surrounding a fan rotor (1). Lateral slits (14) are formed to the housing (5). A width of the slits (14) is set such that laminar flows of air are generated. Patent Document 1 describes that, with this structure, generation of turbulent flows and noise are suppressed.

SUMMARY OF THE INVENTION

In order to suppress the noise, the fans should preferably be further improved. In addition, decreased noise level is strongly requested by users.

In view of the above circumstances, there is a need for an axial fan apparatus and a housing capable of suppressing noise, and an electronic apparatus mounted with the axial fan apparatus.

According to an embodiment of the present invention, there is provided an axial fan apparatus including an axial-flow impeller, a drive unit, and a housing. The axial-flow impeller is capable of rotating and includes a plurality of blades inclined with respect to a rotational axis direction. The drive unit rotates the axial-flow impeller. The housing is mounted with the drive unit, and includes a sidewall, and a plurality of slits that circulate gas. The sidewall is provided around the axial-flow impeller. The plurality of slits are provided to the sidewall and inclined with respect to the rotational axis direction in a direction opposed to a direction in which the plurality of blades incline.

In general, when an axial-flow impeller rotates, there generate airflows (hereinafter referred to as swirling flows) in the vicinity of an end portion of a blade from a surface (air discharge side) opposed to a negative pressure generation surface side (air suction side) of the blade to the negative pressure generation surface side. The swirling flows generate noise. According to this embodiment, when the axial-flow impeller rotates, air flows from the outside of the housing to the inside via the plurality of slits. Since the plurality of slits are inclined in the direction opposed to the direction in which the blades are inclined, the swirling flows are straightened. The noise can thus be suppressed.

In this embodiment, each of the plurality of blades includes an end portion at an outer circumferential side of rotation, a negative pressure generation surface that generates a negative pressure, and an auxiliary vane standing on the negative pressure generation surface at the end portion. Accordingly, the generation of the swirling flows in the vicinity of the end portions of the blades as described above can be suppressed. With the result, the noise can further be suppressed.

In this embodiment, the auxiliary vane has a height from the negative pressure generation surface smaller than twice a thickness of each of the plurality of blades. In the case that the height of the auxiliary vane is too large, when the axial-flow impeller rotates, air sucked via the slits into the housing tends to flow toward the negative pressure generation surface of the blade but is shielded by the auxiliary vanes. In this case, the function for straightening the swirling flows by the slits is deteriorated. However, since the height of the auxiliary vanes from the negative pressure generation surface is smaller than twice the thickness of the blades as described above, the swirling flows are straightened owing to the slits and suppressed owing to the auxiliary vanes in a balanced manner, and the noise level is decreased.

In this embodiment, the sidewall includes an annular inner circumferential surface and an annular outer circumferential surface. That is, the sidewall has substantially the constant thickness. Thus, compared to a sidewall including an annular inner circumferential surface and a plane outer surface, i.e., a sidewall having excessive thickness, the sidewall of this embodiment can have the slits having a larger entire opening area. The housing including the sidewall having the excessive thickness is generally a rectangular parallelepiped in most cases. Compared to the case that the slits, for example, are formed to the plane outer surface, the annular sidewall of this embodiment can have the slits larger in number. The suction amount and flow rate of the gas can thus be increased.

According to another embodiment of the present invention, there is provided a housing provided to an axial fan apparatus including an axial-flow impeller including a plurality of blades inclined with respect to a rotational axis direction, and a drive unit that rotates the axial-flow impeller. The housing includes a mount portion and a sidewall. To the mount portion, the drive unit is mounted. The sidewall is provided around the axial-flow impeller, and has a plurality of slits that circulate gas. The plurality of slits are inclined with respect to the rotational axis direction in a direction opposed to a direction in which the plurality of blades incline.

According to another embodiment of the present invention, there is provided an electronic apparatus including a casing and an axial fan apparatus. The axial fan apparatus includes an axial-flow impeller, a drive unit, and a housing. The axial-flow impeller is capable of rotating and includes a plurality of blades inclined with respect to a rotational axis direction. The drive unit rotates the axial-flow impeller. The housing is mounted with the drive unit and disposed in the casing, and includes a sidewall, and a plurality of slits that circulate gas. The sidewall is provided around the axial-flow impeller. The plurality of slits are provided to the sidewall and inclined with respect to the rotational axis direction in a direction opposed to a direction in which the plurality of blades incline.

As described above, according to the embodiments of the present invention, noise can be suppressed and flow rate can be increased.

These and other objects, features and advantages of the present invention will become more apparent in light of the following detailed description of best mode embodiments thereof, as illustrated in the accompanying drawings.

BRIEF DESCRIPTION OF DRAWINGS

FIGS. 9A, 9B, and 9C show data of the graph of FIG. 8;

FIGS. 14A and 14B show simulation for determining positions of noise sources when the blades including the auxiliary vanes rotate;

FIGS. 15A and 15B show simulation illustrating pressure distribution of air when the blades including the auxiliary vanes rotate.

DESCRIPTION OF PREFERRED EMBODIMENTS

In the following, embodiments of the present invention will be described with reference to the accompanying drawings.

Figure 1:
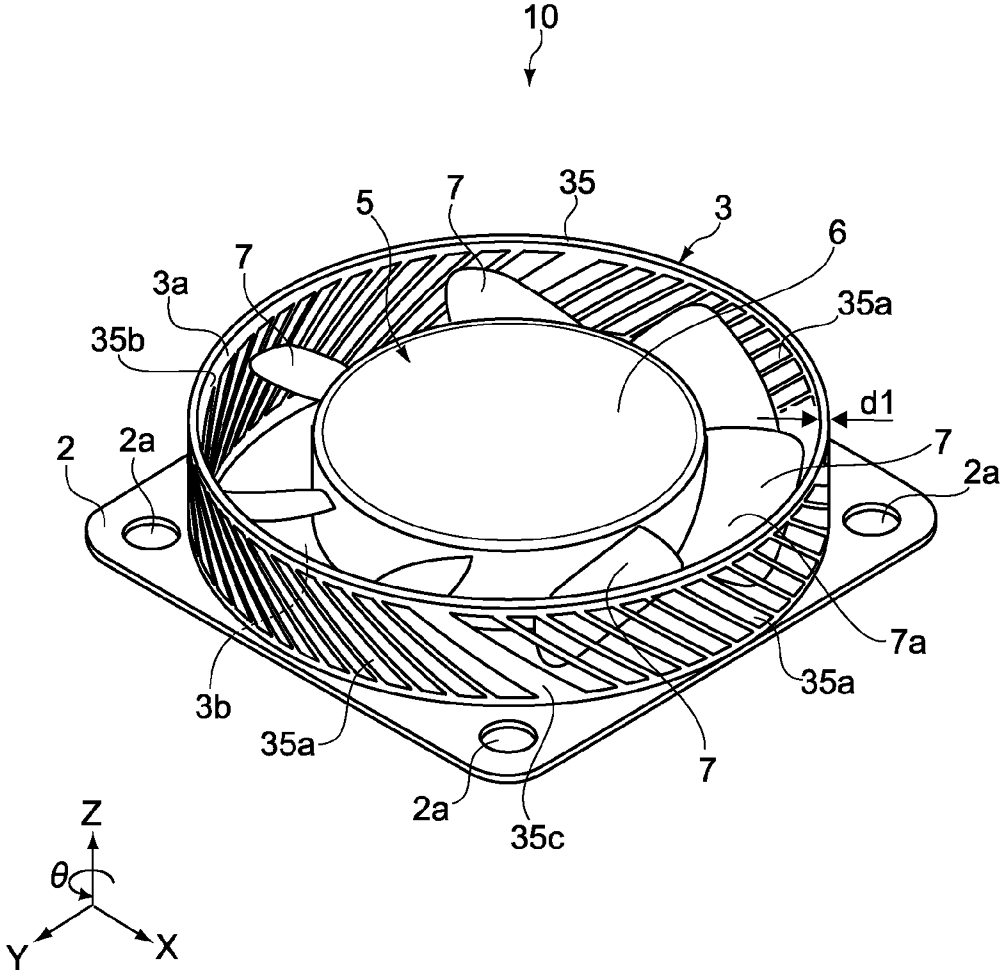
FIG. 1 is a perspective view showing an axial fan apparatus according to an embodiment of the present invention.
Figure 2:
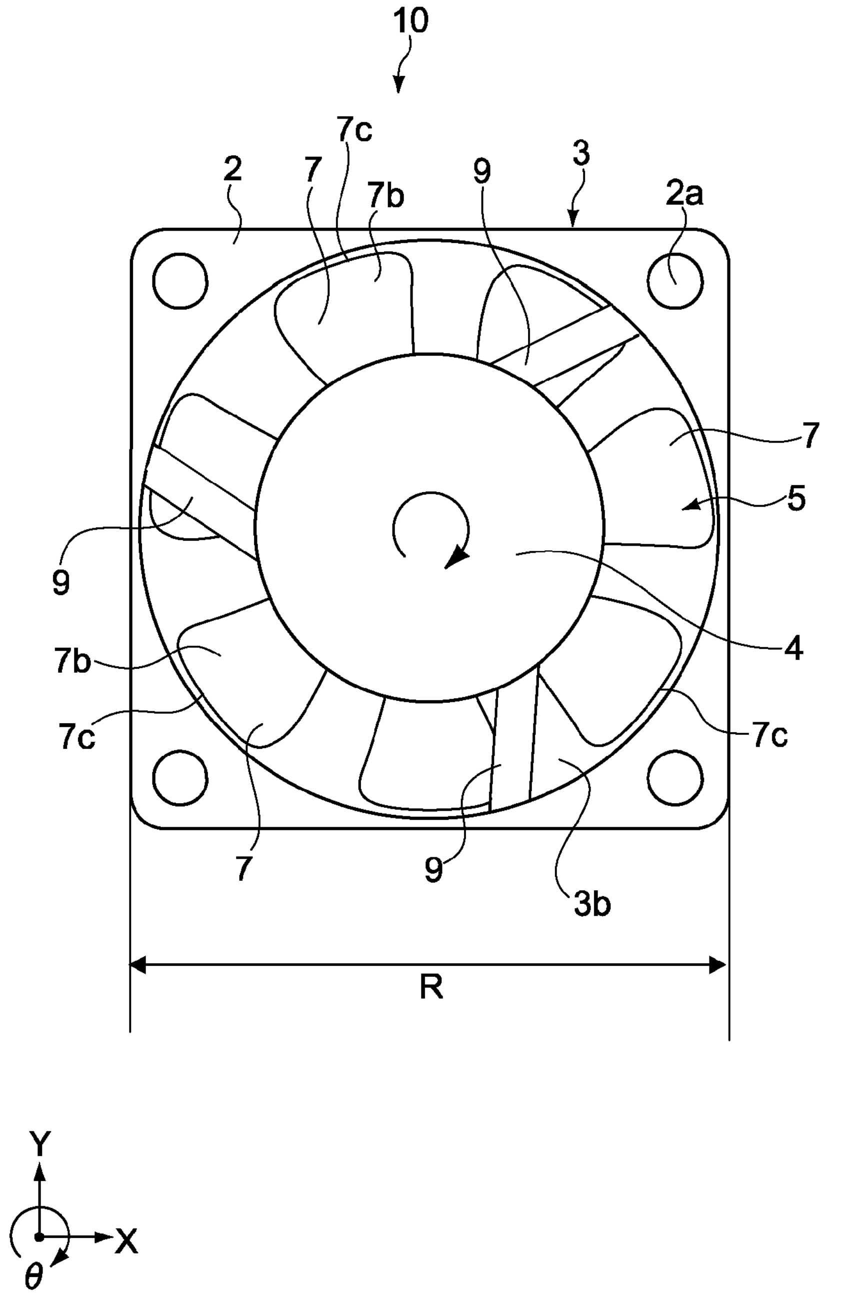
FIG. 2 is a plan view showing the axial fan apparatus of FIG. 1 seen from a back surface side thereof.
Figure 3:
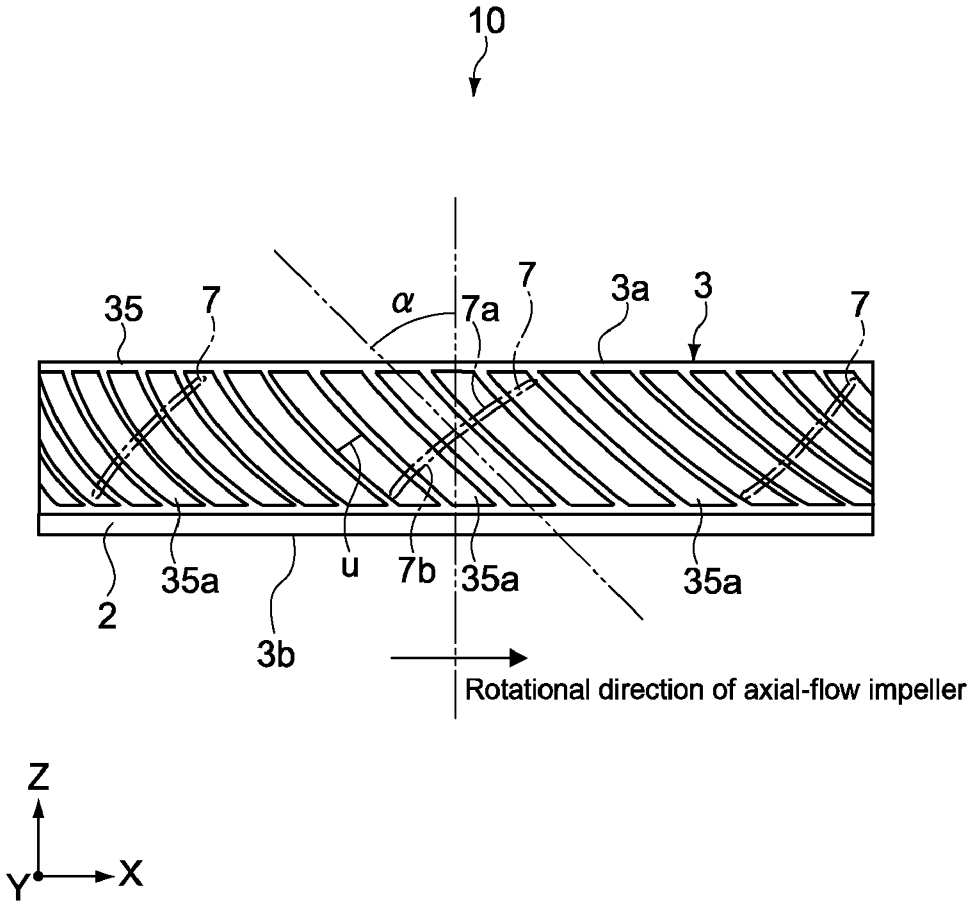
FIG. 3 is a side view of the axial fan apparatus of FIG. 1.

FIG. 1 is a perspective view showing an axial fan apparatus according to an embodiment of the present invention. FIG. 2 is a plan view showing the axial fan apparatus of FIG. 1, denoted by reference numeral 10, seen from a back surface side thereof. FIG. 3 is a side view of the axial fan apparatus 10.

The axial fan apparatus 10 includes a housing 3 and an axial-flow impeller 5. The axial-flow impeller 5 is capable of rotating inside the housing 3. The axial-flow impeller 5 includes a boss unit 6 and a plurality of blades 7. A motor (drive unit; not shown) is built in the boss unit 6. The plurality of blades 7 are provided around the boss unit 6.

The housing 3 includes an annular sidewall 35. An opening at an upper portion of the sidewall 35 serves as a suction port 3*a*. Airflows in an axial direction (Z direction) generated by the blades 7 rotating in a θ direction are sucked into the housing 3 via the suction port 3*a*. As shown in FIG. 2, a discharge port 3*b* is provided to a lower portion of the sidewall 35. The discharge port 3*b* discharges the gas sucked via the suction port 3*a*. The gas is typically air, but may be of another kind. Hereinafter, the gas is assumed to be air. It should be noted that a mount plate 2 is provided to the lower portion of the sidewall 35. The mount plate 2 is used in the case of mounting the axial fan apparatus 10 to a given position in an electronic apparatus. The mount plate 2 is provided with screw holes 2*a*. The axial fan apparatus 10 is mounted thereto with screws.

As shown in FIG. 2, a hold plate 4 is disposed to the discharge port 3*b*. The hold plate 4 is coupled to ribs 9 and serves as a mount portion to which the motor is mounted. The mount portion may have any shape instead of a plate shape as in the case of the hold plate 4. A circuit board (not shown) that drives the motor is provided onto the hold plate 4. The motor is arranged onto the circuit board and inside the boss unit 6.

The sidewall 35 of the housing 3 is provided with a plurality of slits 35*a* via which the gas is circulated. As shown in FIG. 3, the plurality of slits 35*a* incline with respect to a rotational axis direction (Z direction) of the axial-flow impeller 5 in a direction opposed to a direction in which the blades 7 incline. As shown in FIG. 3, the blades 7 incline from bottom left to top right with respect to the rotational axis direction.

The slits 35*a* are provided by predetermined pitches in a rotational circumferential direction (θ direction) of the axial-flow impeller 5. The pitch can arbitrarily be set. The pitch may be set depending on a width u of the slit 35*a* and a diameter R (refer to FIG. 2) of the sidewall 35 of the housing 3. All the slits 35*a* have substantially the same widths u. In the case that, for example, the diameter R of the sidewall 35 is 40 to 60 mm, the width u of the slit 35*a* is 1 to 2 mm. However, they are not limited to the above. Alternatively, the slits 35*a* may have different widths u depending on positions.

The blade 7 includes a negative pressure generation surface 7*a* at the suction port 3*a* side, and a back surface 7*b* opposed to the negative pressure generation surface 7*a*. The negative pressure generation surface 7*a* generates laminar flows of the gas, to thereby generate a negative pressure, and is curved. So, in a precise sense, the inclination of the blade 7 refers to an inclination of a tangent line at a given point on the curved negative pressure generation surface 7*a*, specifically, an inclination of the tangent line in the rotational circumferential direction of the axial-flow impeller 5 with respect to the rotational axis direction. Alternatively, the inclination of the blade 7 may be an average inclination of a plurality of tangent lines.

Meanwhile, the inclination of the slit 35*a* with respect to the rotational axis direction refers to an inclination α of the slit 35*a* in a longitudinal direction with respect to the rotational axis direction. The inclination α of the slit 35*a* is an inclination from bottom right to top left. The inclination α of the slit 35*a* is opposed to the inclination of the blade 7 closest to the slit 35*a* with respect to the rotational axis direction. The inclination α of the slit 35*a* with respect to the rotational axis direction is larger than 0° and smaller than 90°. The inclination α is typically 30° to 60°, specifically, 45°.

The axial-flow impeller 5 is typically made of a resin, but may be made of metal, rubber, or the like. The housing 3 is also typically made of a resin, but may be made of other materials.

Functions of the axial fan apparatus 10 structured as described above will be described.

Figure 4:
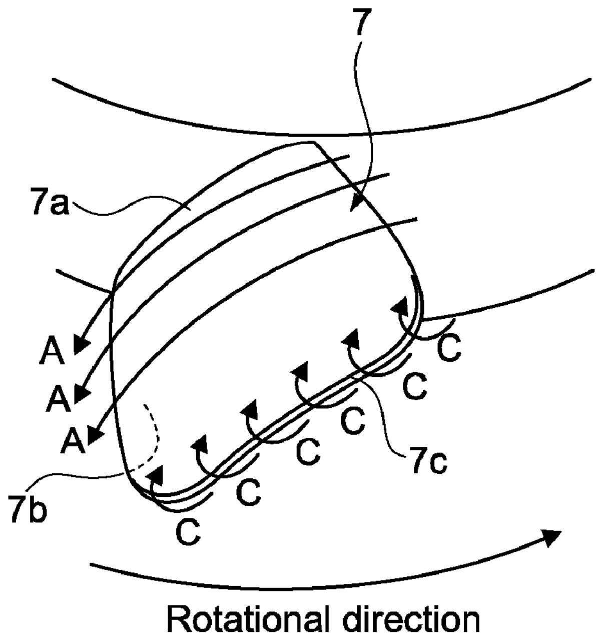
FIG. 4 is a diagram illustrating functions of a blade and swirling flows.

The driving of the motor causes the axial-flow impeller 5 to rotate. The rotational direction of the blades 7 is counterclockwise seen from the top surface side of FIG. 1. As shown in FIG. 4, the rotation of the axial-flow impeller 5 generates airflows A on the negative pressure generation surface 7*a* of the blade 7, to thereby generate a negative pressure in the vicinity of the negative pressure generation surface 7*a*. Thus, airflows are generated from the suction port 3*a* of the housing 3 in the axial-flow direction, and the air is discharged from the discharge port 3*b*.

Figure 5:
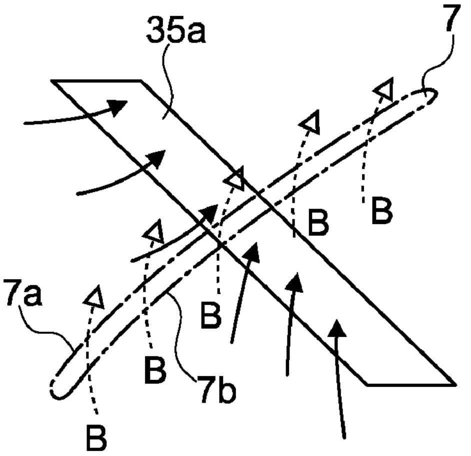
FIG. 5 is a diagram for comparing an inclination of a slit and that of the blade.

As shown in FIG. 4, since a negative pressure is generated in the vicinity of the negative pressure generation surface 7*a*, the airflows generally tend to flow into the negative pressure generation surface 7*a* side from the back surface 7*b* side of the blade 7 via an end portion 7*c* on an outer circumferential side of the blade 7. That is, eddy flows are generated. Hereinafter, the eddy flows are referred to as swirling flows C. The swirling flows C generate noise. In this case, since the negative pressure is generated in the vicinity of the negative pressure generation surface 7*a*, air is flown from the outside of the housing 3 into the inside of the housing 3 via the slits 35*a* of the housing 3. Since the slits 35*a* incline in the direction opposed to the inclination direction of the blades 7, the air took in the housing 3 via the slits 35*a* straighten the swirling flows C and the straighten airflows B are generated as shown in FIG. 5. That is, the generation of eddy flows is suppressed, and thus the noise is suppressed.

Figure 6:
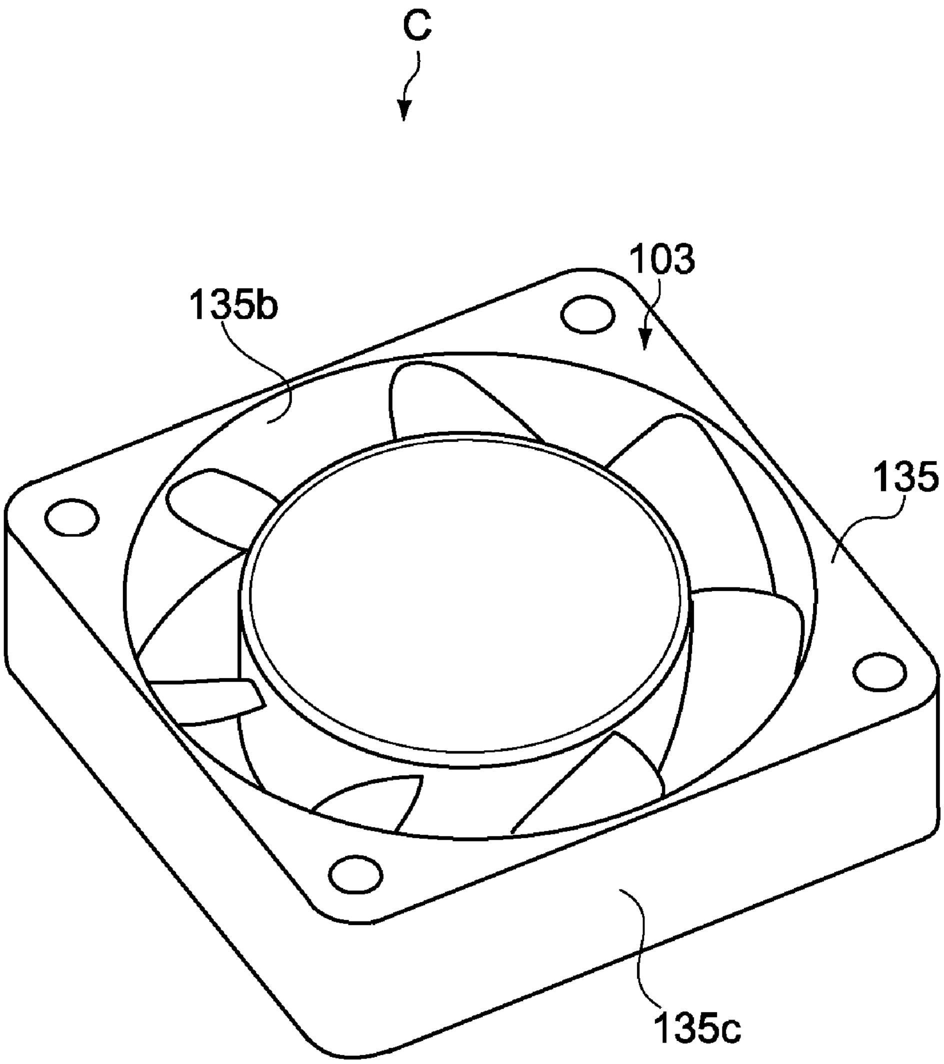
FIG. 6 is a perspective view showing a general axial fan apparatus in the past.

In addition, according to this embodiment, as shown in FIG. 1, the sidewall 35 has an annular shape, that is, includes an annular inner circumferential surface 35*b* and an annular outer circumferential surface 35*c*. The sidewall 35 thus has a substantially constant thickness d1. Owing to this structure, compared to a sidewall 135 including an annular inner circumferential surface 135*b* and a plane outer surface 135*c* as shown in FIG. 6, i.e., the sidewall 135 having excessive thickness, the sidewall 35 can have the slits 35*a* having a larger entire opening area. Note that FIG. 6 is a perspective view showing a general axial fan apparatus in the past. A housing 103 including the sidewall 135 having the excessive thickness is generally a rectangular parallelepiped in most cases. Compared to the case that the slits 35*a*, for example, are formed to the plane outer surface 135*c*, the annular sidewall 35 of this embodiment can have the slits 35*a* larger in number. The suction amount and flow rate of the gas can thus be increased.

Figure 7:
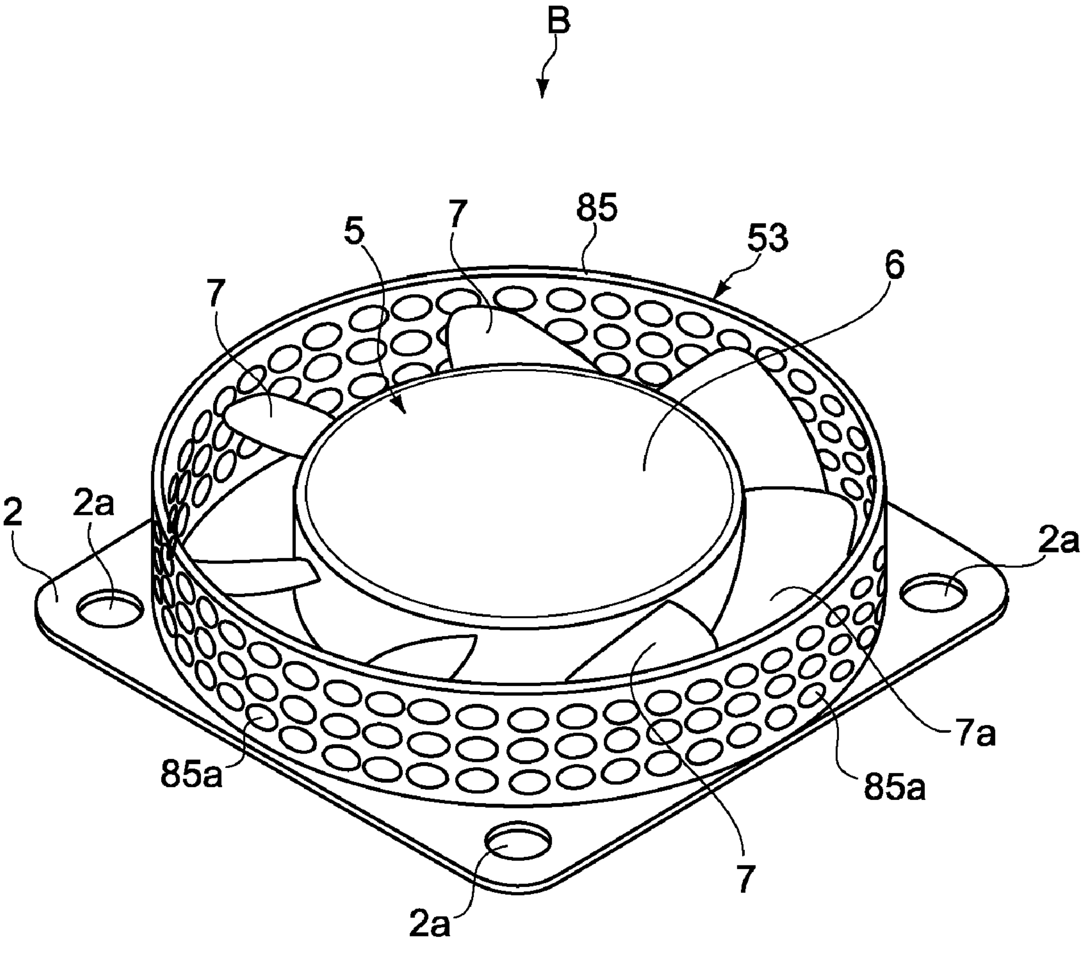
FIG. 7 is a perspective view showing an axial fan apparatus in which an annular sidewall of a housing is provided with a plurality of circular vent holes.
Figure 8:
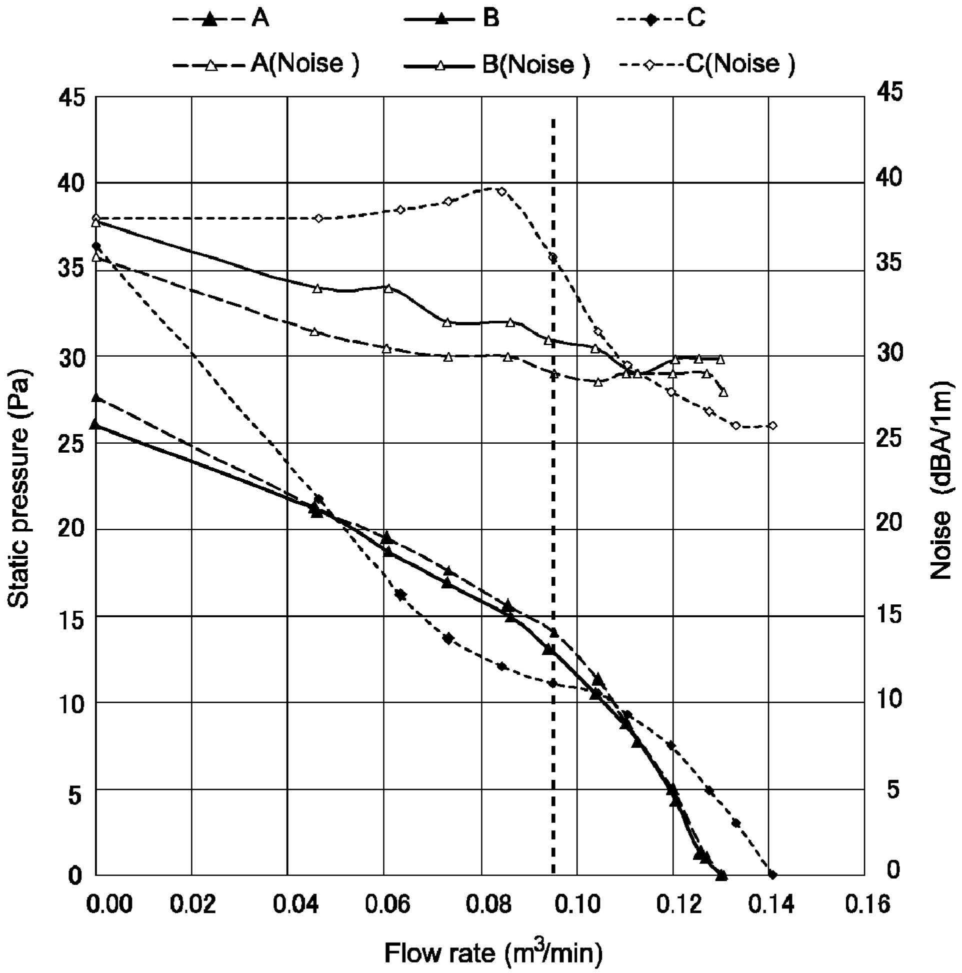
FIG. 8 is a graph showing measurement results of a P-Q characteristic (and a noise level characteristic) regarding the axial fan apparatus of FIG. 1, the axial fan apparatus of FIG. 6, and the axial fan apparatus of FIG. 7.

FIG. 7 is a perspective view showing an axial fan apparatus in which an annular sidewall 85 of a housing 53 is provided with a plurality of circular vent holes 85*a*. FIG. 8 is a graph showing measurement results of a P-Q characteristic (flow rate-static pressure characteristic) and a noise level characteristic regarding the axial fan apparatus 10 of this embodiment shown in FIG. 1 (axial fan apparatus A), the axial fan apparatus shown in FIG. 6 (axial fan apparatus C), and the axial fan apparatus shown in FIG. 7 (axial fan apparatus B). In this experiment, design values of the axial fan apparatuses A, B, and C are as follows.

(1) Axial fan apparatus A

Diameter of sidewall: 40 mm

Entire opening area of slits 35*a*: 476 $mm^2$

Inclination θ of slits 35*a*: 45°

(2) Axial fan apparatus B

Diameter of sidewall: 40 mm

Entire opening area of vent holes: 414.5 $mm^2$ (3) Axial fan apparatus C

Length of one side of sidewall of housing 3: 40 mm

It should be noted that, in each of the axial fan apparatus A, B, and C, the diameter of the axial-flow impeller is smaller by 0.5 to 2 mm than the diameter of the sidewall, or, in the item (3), than the length of one side of the sidewall 135 of the housing 103.

Generally, the axial fan apparatuses operate with flow rate of ±(10 to 20)% with half the maximum flow rate as a standard (hereinafter referred to as "operating point range"). To be specific, an intersection point of the P-Q curve and a system impedance curve (not shown) may, in most cases, be an operating point (e.g., 0.95). In the graph, the flow rate of the three axial fan apparatuses A, B, and C is, for example, 0.06 to 0.10 $m^3$/min in the operating point range.

In the operating point range, the axial fan apparatus A of this embodiment represents the highest static pressure. That is, in the operating point range, the flow rate of the axial fan apparatus A (10) is larger than those of the axial fan apparatuses B and C when it is assumed that those axial fan apparatuses represent the same static pressure. In addition, in the operating point range, the noise level of the axial fan apparatus A is the lowest, and that of the general axial fan apparatus C in the past is the highest of the three. The noise level of the axial fan apparatus A is lower by 9 to 10 dB than that of the axial fan apparatus C.

It should be noted that FIGS. 9A, 9B, and 9C show data of the graph of FIG. 8.

Figure 10:
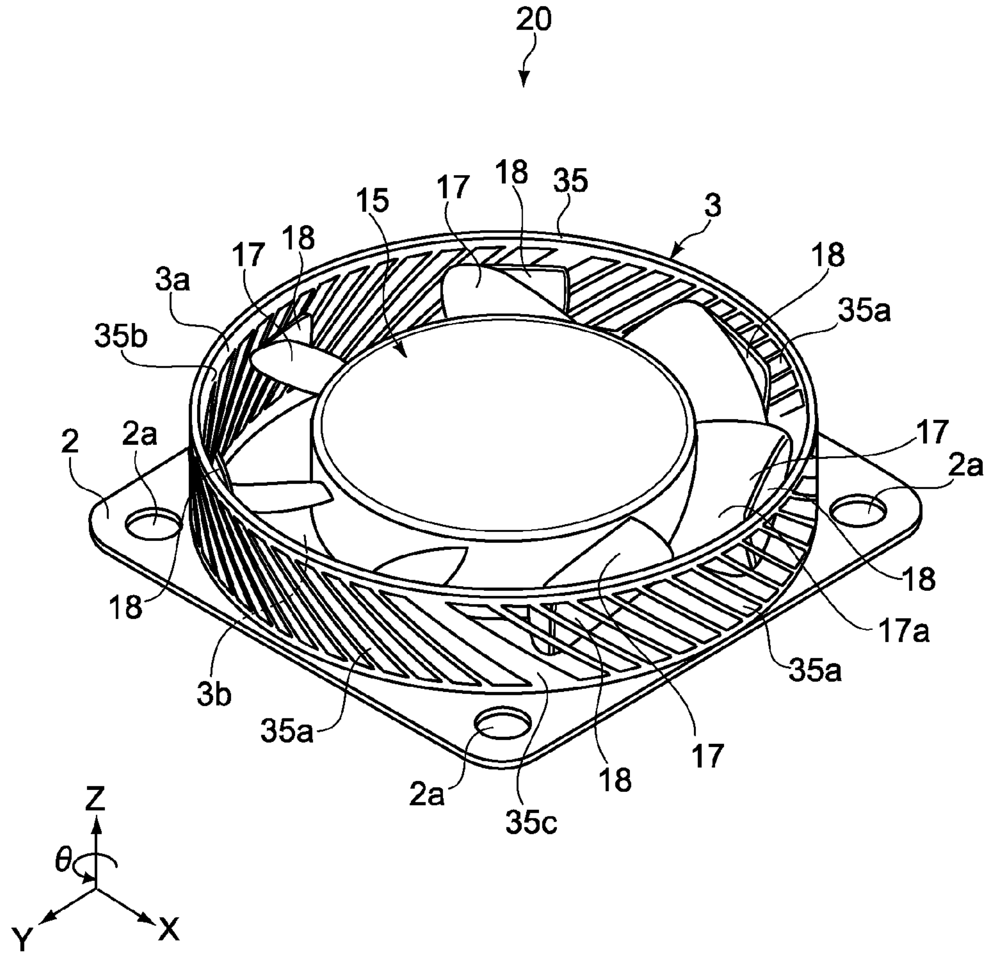
FIG. 10 is a perspective view showing an axial fan apparatus according to another embodiment of the present invention.

FIG. 10 is a perspective view showing an axial fan apparatus according to another embodiment of the present invention. In the following, description of members, functions, and the like similar to those of the axial fan apparatus 10 of the above embodiment shown in FIG. 1 and other figures will be simplified or omitted. Members, functions, and the like different from those of the axial fan apparatus 10 will mainly be described.

In the axial fan apparatus of this embodiment, denoted by reference numeral 20, each blade 17 of an axial-flow impeller 15 is provided with an auxiliary vane 18. The auxiliary vane 18 stands on a negative pressure generation surface 17*a* at an end portion 17*c* (refer to FIG. 11) at an outer circumferential side of rotation of the blade 17. Typically, the auxiliary vane 18 stands from a horizontal plane (X-Y plane) by substantially 90 degrees. However, the angle may be set to 70 to 110 degrees, or may be set to an angle outside that range.

Further, the housing 3 has the same structure as that of the housing 3 of the above embodiment. The sidewall 35 includes the slits 35*a*. The inclination of the slits 35*a* is opposed to an inclination of the blades 17.

Figure 11:
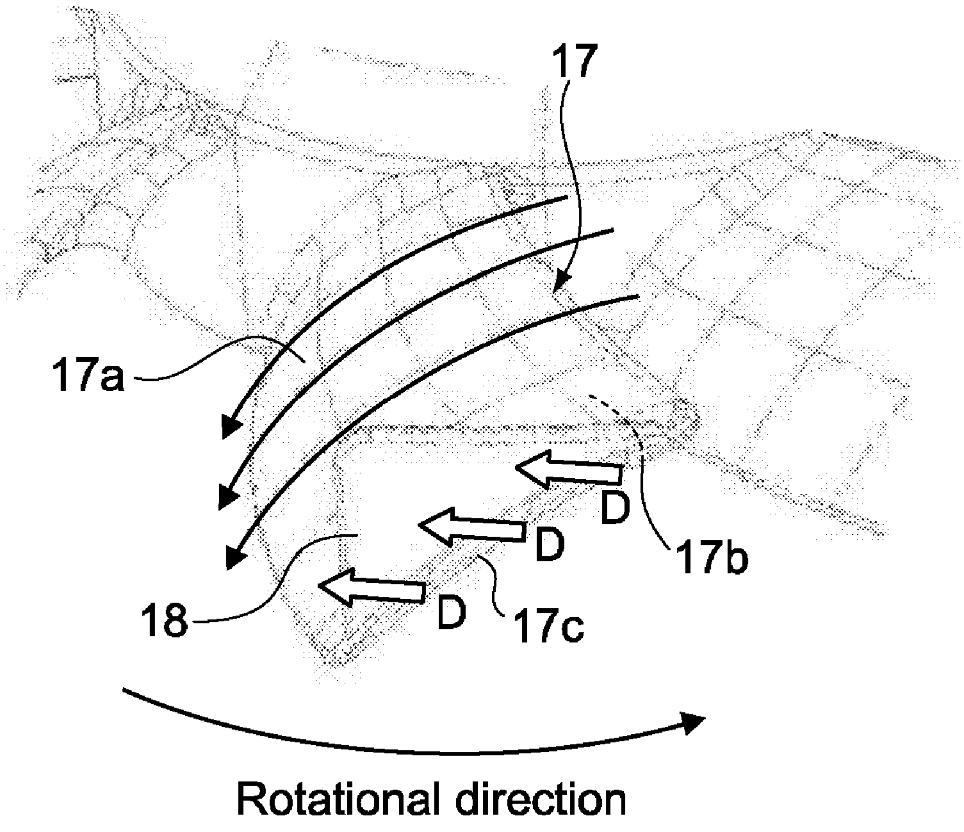
FIG. 11 is a diagram illustrating functions and effects of an auxiliary vane.

Since each blade 17 includes the auxiliary vane 18 as described above, the swirling flows C are straightened. For example, as shown in FIG. 11, the swirling flows C are suppressed and laminar flows D are generated along the auxiliary vane 18. Noise is thus suppressed.

The height of the auxiliary vane 18 from the negative pressure generation surface 17*a* (height of a portion of the auxiliary vane 18 from the negative pressure generation surface 17*a*, the portion being most distant from the negative pressure generation surface 17*a*) is not limited as long as the auxiliary vane 18 does not contact the other members. Specifically, in the case that the height of the auxiliary vane 18 is smaller than twice the thickness of the blade 17 from the negative pressure generation surface 17*a*, the noise level can further be decreased, which will be described below.

Figure 12:
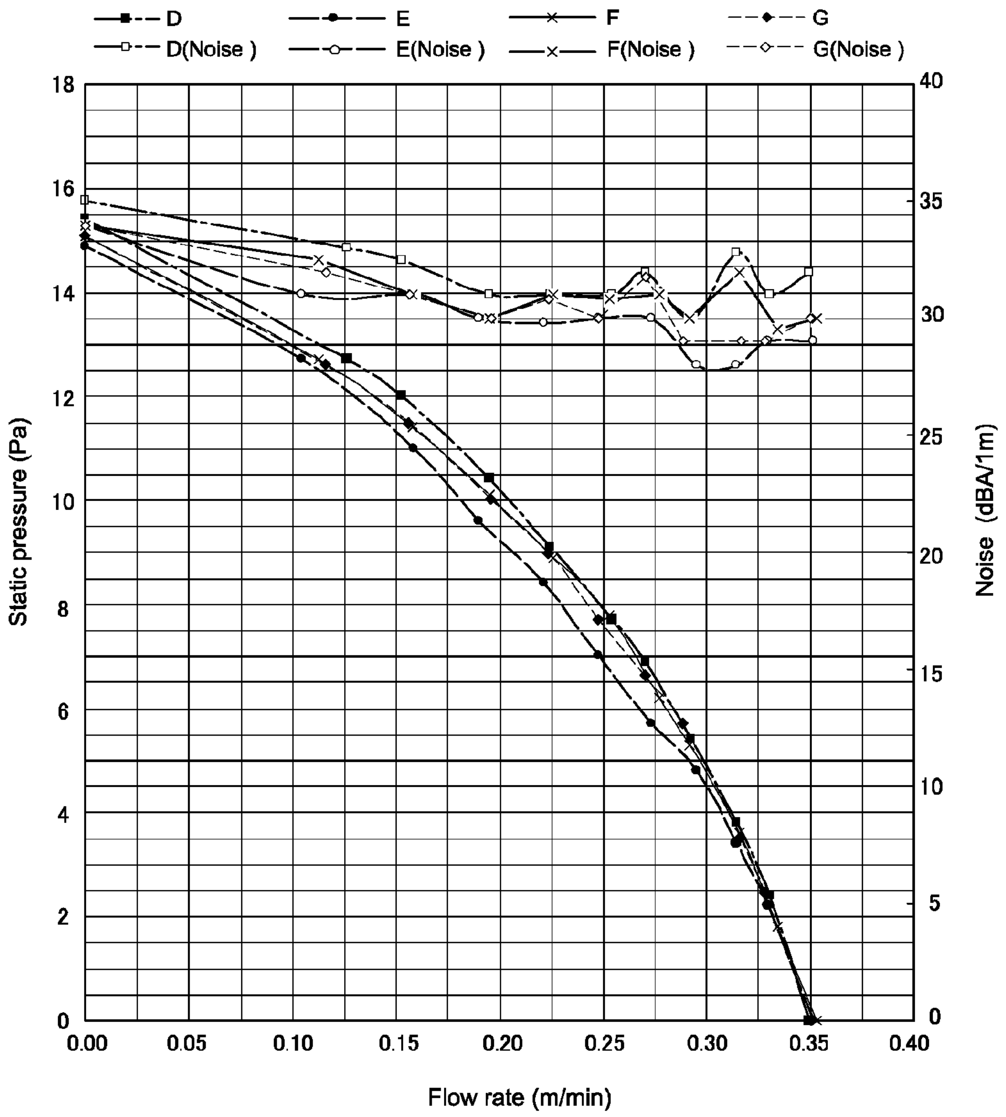
FIG. 12 is a graph showing measurement results of a P-Q characteristic (and a noise level characteristic) regarding an axial fan apparatus including an axial-flow impeller without auxiliary vanes, and axial fan apparatuses respectively including three kinds of axial-flow impellers having auxiliary vanes different in height.

FIG. 12 is a graph showing measurement results of a P-Q characteristic (and a noise level characteristic) regarding an axial fan apparatus including an axial-flow impeller without the auxiliary vanes 18, and axial fan apparatuses respectively including three kinds of axial-flow impellers having the auxiliary vanes 18 different in height. In the experiment described referring to FIG. 12, the axial fan apparatus including the axial-flow impeller without the auxiliary vanes 18 is denoted by D. In addition, the three axial fan apparatuses are denoted by E, F, and G in the descending order of the height of the auxiliary vanes 18. The axial fan apparatus D used in the experiment described referring to FIG. 12 is designed substantially similar to the axial fan apparatus A used in the experiment described referring to FIG. 8. The axial fan apparatuses E, F, and G are obtained by employing the auxiliary vanes 18 having different height in the axial fan apparatus A.

Figure 13:
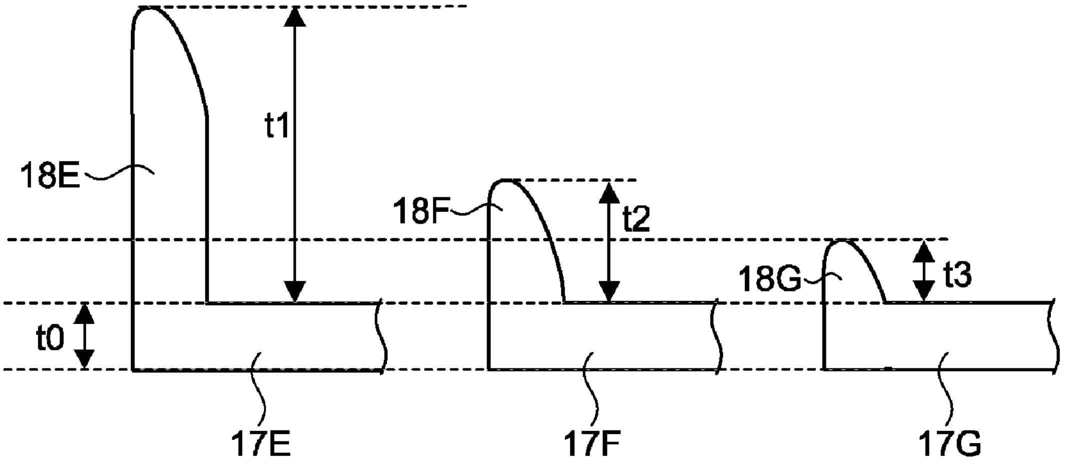
FIG. 13 is a diagram illustrating respective heights of the auxiliary vanes of the three axial fan apparatuses.

FIG. 13 is a diagram illustrating an auxiliary vane 18E of the axial fan apparatus E, an auxiliary vane 18F of the axial fan apparatus F, and an auxiliary vane 18G of the axial fan apparatus G. A blade of an axial-flow impeller of the axial fan apparatus E is denoted by reference symbol 17E, a blade of an axial-flow impeller of the axial fan apparatus F is denoted by reference symbol 17F, and a blade of an axial-flow impeller of the axial fan apparatus G is denoted by reference symbol 17G. A height t1 of the auxiliary vane 18E of the axial fan apparatus E is the largest of the three, and is larger than three times a thickness t0 of the blade 17E. A height t2 of the auxiliary vane 18F of the axial fan apparatus F is larger than the thickness t0 of the blade 17F, but smaller than twice the thickness t0 (2×t0). A height t3 of the auxiliary vane 18G of the axial fan apparatus G is smaller than the thickness t0 of the blade 17G.

The graph of FIG. 12 teaches as follows. In the operating point range, the static pressure of the axial fan apparatus E including the auxiliary vane 18E largest in height is lower than that of the axial fan apparatus D without auxiliary vanes, specifically, is the lowest of the four. However, the noise level of the axial fan apparatus E is the lowest of the four. When the axial fan apparatuses F and G are employed, the static pressure can be increased while the noise level can be decreased. In other words, the auxiliary vane 18F having the height t2 and the auxiliary vane 18G having the height smaller than the height t2 are preferable. Specifically, the auxiliary vane 18G having the height t3 is most preferable.

FIGS. 14A, 14B, 15A, and 15B are diagrams each showing simulation of a state of fluid in the vicinity of the auxiliary vane 18G having the height t3 or the auxiliary vane 18F having the height t2 and the slit 35*a* of the housing 3. FIGS. 14A and 14B show simulation for determining positions of noise sources. FIGS. 15A and 15B show simulation illustrating pressure distribution of air. FIG. 14A shows the auxiliary vane 18G, FIG. 14B, the auxiliary vane 18F, FIG. 15A, the auxiliary vane 18G, and FIG. 15B, the auxiliary vane 18F.

As shown in FIGS. 14A and 14B, a noise source is generated in the vicinity of a side surface of an outer circumferential surface of each of the auxiliary vanes 18G and 18F. The noise source area in the case of the auxiliary vane 18G is smaller than that in the case of the auxiliary vane 18F. However, in the case of the auxiliary vane 18G, a noise source is generated inside the slit 35*a*.

As shown in FIGS. 15A and 15B, the auxiliary vane 18F having the height t2 suppresses the swirling flows C more effectively than the auxiliary vane 18G. Meanwhile, since the auxiliary vane 18G has the height t3 smaller than the height t2, low pressure area generated in the vicinity of the negative pressure generation surface 17*a* of the blade 17G expands to the vicinity of the slit 35*a* as shown in the dotted circle H of FIG. 15A. That is, the pressure difference is large in the vicinity of the slit 35*a*. Accordingly, in the case of the auxiliary vane 18G having the height t3, the swirling flows C are suppressed owing to the slit 35*a*.

In view of the above, the height of the auxiliary vane 18 from the negative pressure generation surface 17*a* is preferably smaller than twice the thickness of the blade 17. With this structure, the swirling flows C are straightened owing to the slit 35*a* and suppressed owing to the auxiliary vane 18 in a balanced manner, the flow rate is increased, and the noise level is decreased.

Figure 16:
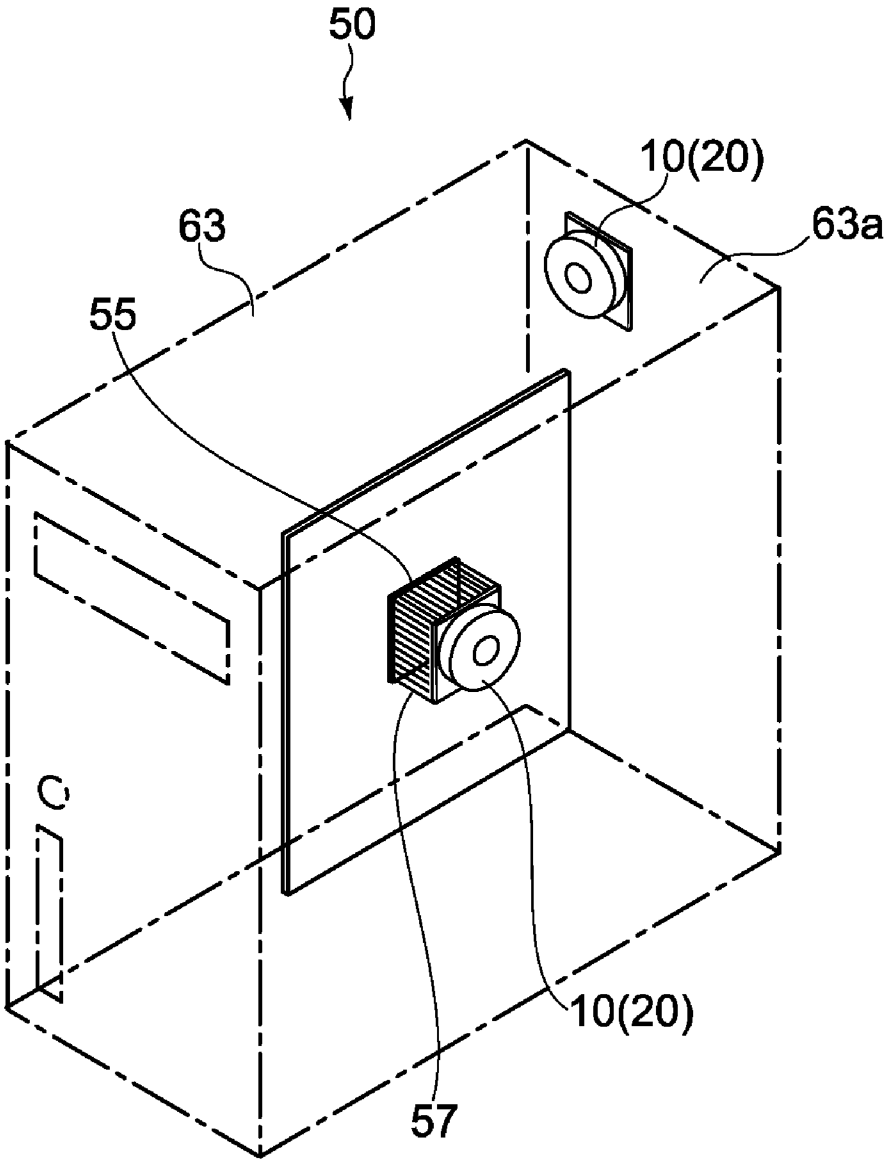
FIG. 16 is a schematic perspective view showing an electronic apparatus according to another embodiment of the present invention, specifically, a desktop PC.

FIG. 16 is a schematic perspective view showing an electronic apparatus according to another embodiment of the present invention, specifically, a desktop PC (Personal Computer).

The PC, denoted by reference numeral 50, includes a casing 63. The axial fan apparatus 10 (20) is arranged inside the casing 63. The axial fan apparatus 10 (20) is mounted to, for example, an opening portion (not shown) provided to a back surface 63*a* of the casing 63. Alternatively, the axial fan apparatus 10 (20) is mounted to, for example, a heat sink 57 connected to a CPU 55.

The electronic apparatus is not limited to a desktop PC as in the case of the PC 50, but may be a server computer, a display apparatus, an AV device, a projector, a game device, a car navigation device, or other electronic products.

Embodiments of the present invention are not limited to the embodiments as described above, but may be other various embodiments.

For example, in the axial fan apparatus 10, 20 according to the embodiments of the present invention, the slits 35*a* are provided to the substantially entire circumference of the sidewall in the circumferential direction. However, the plurality of slits 35*a* may be provided to a part of the sidewall corresponding to a predetermined angle in the circumferential direction. Alternatively, two groups of the slits 35*a* by the predetermined angle in the circumferential direction may be 180°-symmetrically provided to the sidewall. Alternatively, three groups of the slits 35*a* by the predetermined angle in the circumferential direction may be 120°-symmetrically provided to the sidewall. As described above, the slits 35*a* can be provided in a various manner.

It should be understood by those skilled in the art that various modifications, combinations, sub-combinations and alternations may occur depending on design requirements and other factors insofar as they are within the scope of the appended claims or the equivalents thereof.

What is claimed is:

1. An axial fan apparatus, comprising:

an axial-flow impeller capable of rotating to effect a flow of gas to cool down one or more heat generators, the axial-flow impeller including a plurality of blades inclined with respect to a rotational axis direction;

a drive unit that rotates the axial-flow impeller; and a housing mounted with the drive unit, the housing including an annular sidewall around the axial-flow impeller, the annular sidewall including a plurality of slits that enable the circulation of the gas, the plurality of slits being adjacently spaced, defined entirely within the annular sidewall, and inclined with respect to the rotational axis direction in a direction opposed to a direction in which the plurality of blades incline, the axial-flow impeller and the plurality of slits being configured to affect the flow of the gas to suppress noise produced by the axial-flow impeller, a mount plate extends from a lower portion of the annular sidewall for mounting the axial fan apparatus, wherein each of the plurality of blades includes an end portion at an outer circumferential side of rotation, a negative pressure generation surface that generates a negative pressure, and an auxiliary vane standing on the negative pressure generation surface at the end portion.

2. The axial fan apparatus as set forth in claim 1, wherein:

the auxiliary vanes extend from a horizontal plane from 70 degrees to 110 degrees;

the gas flow passes through a suction port of the housing in an axial direction and is discharged at a discharge port of the housing defined by the lower portion of the annular sidewall; and gas flows into the housing through the plurality of slits to straighten swirling flows to suppress the noise.

3. The axial fan apparatus as set forth in claim 2, wherein the auxiliary vane has a height from the negative pressure generation surface smaller than twice a thickness of each of the plurality of blades.

4. The axial fan apparatus as set forth in claim 1, wherein:
the auxiliary vane extends vertically from each of the plurality of blades;
a height of the auxiliary vane is less than a wide of the plurality of blades;
the annular sidewall includes an annular inner circumferential surface and an annular outer circumferential surface; and
the annular sidewall includes an upper band and a lower band through which the plurality of slits do not pass.

5. A housing specially configured for an axial fan apparatus including an axial-flow impeller including a plurality of blades inclined with respect to a rotational axis direction, and a drive unit that rotates the axial-flow impeller to effect a flow of gas to cool down one or more heat generators utilizing the flow of gas, the housing comprising:
a mount portion to which the drive unit is mounted;
an annular sidewall provided around the axial-flow impeller, a lower portion of the annular sidewall being connected to the mount portion; and
a plurality of slits defined entirely within the annular sidewall to enable a circulation of the gas, the plurality of slits being adjacently spaced and inclined with respect to the rotational axis direction in a direction opposed to a direction in which the plurality of blades incline, the slits being configured to cooperate with the axial flow impeller to affect the flow of the gas to suppress noise produced by the axial-flow impeller,
wherein, each of the plurality of blades includes an end portion at an outer circumferential side of rotation, a negative pressure generation surface that generates a negative pressure, and an auxiliary vane standing on the negative pressure generation surface at the end portion.

6. An electronic apparatus, comprising:
a casing; and
an axial fan apparatus including (a) an axial-flow impeller capable of rotating to cause a flow of gas to cool down one or more heat generators utilizing the flow of gas, the axial-flow impeller including a plurality of blades inclined with respect to a rotational axis direction, each of the plurality of blades including an end portion at an outer circumferential side of rotation, a negative pressure generation surface that generates a negative pressure and an auxiliary vane standing on the negative pressure generation surface at the end portion, and (b) a drive unit that rotates the axial-flow impeller, and (c) a housing mounted with the drive unit and disposed in the casing,
wherein,
the housing includes an annular sidewall provided around the axial-flow impeller,
the housing includes a plurality of slits defined entirely within the annular sidewall that enable the circulation of the gas, the plurality of slits being adjacently spaced and inclined with respect to the rotational axis direction in a direction opposed to a direction in which the plurality of blades incline,
a mount plate extends from a lower portion of the annular sidewall for mounting the electronic apparatus, and
the slits and the axial flow impeller cooperating to affect the flow of the gas to suppress noise produced by the axial-flow impeller.

7. The axial fan apparatus of claim 1, wherein the plurality of slits, and the auxiliary vanes straighten airflows to suppress the noise caused by the flow of the gas.

8. The axial fan apparatus of claim 7, wherein the axial fan apparatus is a cooling fan, the plurality of slits and the auxiliary vanes remove eddy flows to suppress the noise.

9. The axial fan apparatus of claim 8, wherein the auxiliary vane extends vertically from each of the plurality of blades, a height of the auxiliary vane is less than a width of the plurality of blades, and a width of the annular sidewall is less than 1.0 mm.

10. The housing of claim 5, wherein:
the axial fan apparatus is a cooling fan,
the gas flow passes through a suction port of the housing in an axial direction and is discharged at a discharge port of the housing defined by the lower portion of the annular sidewall, and
gas flows into the housing through the plurality of slits to straighten swirling flows to suppress the noise.

11. The housing of claim 10, wherein the auxiliary vane extends vertically from each of the plurality of blades, and a height of the auxiliary vane is less than a width of the plurality of blades.

12. The electronic apparatus of claim 6, wherein:
the axial fan apparatus is a cooling fan,
the gas flow passes through a suction port of the housing in an axial direction and is discharged at a discharge port of the housing defined by the lower portion of the annular sidewall, and
gas flows into the housing through the plurality of slits to straighten swirling flows to suppress the noise.

13. The electronic apparatus of claim 12, wherein the auxiliary vane extends vertically from each of the plurality of blades, wherein a height of the auxiliary vane is less than a width of the plurality of blades, and a width of the annular sidewall is uniform.

* * * * *